US005606213A

United States Patent [19]

Kherani et al.

[11] Patent Number: 5,606,213

[45] Date of Patent: Feb. 25, 1997

[54] NUCLEAR BATTERIES

[75] Inventors: Nazir P. Kherani, Etobicoke; Walter T. Shmayda, King City; Stefan Zukotynski, Richmond Hill, all of Canada

[73] Assignee: Ontario Hydro, Toronto, Canada

[21] Appl. No.: 282,294

[22] Filed: Jul. 29, 1994

Related U.S. Application Data

[63] Continuation-in-part of Ser. No. 49,305, Apr. 21, 1993, abandoned.

[51] Int. Cl.[6] .............................. H01L 31/04; G21H 1/00

[52] U.S. Cl. .............................................. 310/303; 136/258

[58] Field of Search ............................. 310/303; 136/253, 136/258; 252/625, 644; 429/5

[56] References Cited

U.S. PATENT DOCUMENTS

| | | | |
|---|---|---|---|
| 2,745,973 | 5/1956 | Rappaport . | |
| 2,976,433 | 3/1961 | Rappaport et al. . | |
| 2,998,550 | 8/1961 | Collins et al. . | |
| 4,024,420 | 5/1977 | Anthony et al. . | |
| 4,508,932 | 4/1985 | Zukotynski | 136/258 |
| 4,628,143 | 12/1986 | Brotz . | |
| 4,900,368 | 2/1990 | Brotz . | |
| 4,946,514 | 8/1990 | Nagakawa . | |
| 5,008,579 | 4/1991 | Conley et al. . | |
| 5,082,505 | 1/1992 | Cota et al. . | |
| 5,110,370 | 5/1992 | Vogeli et al. . | |
| 5,118,951 | 6/1992 | Kherani et al. | 250/462.1 |
| 5,124,610 | 6/1992 | Conley et al. . | |
| 5,127,964 | 7/1992 | Hamakawa et al. . | |
| 5,230,746 | 7/1993 | Wiedeman et al. . | |
| 5,235,232 | 8/1993 | Conley et al. . | |

OTHER PUBLICATIONS

Nelson et al, J. Soc. Sci., Technol. A., Voc. Surl. Films (USA), vol. 8, #3, pp. 8–1, pp.1538–1543, Jun. 1990; abst. only herewith.

Manasse et al, IEEE Trans. Nuc. Sci., vol. NS–23, #1, Feb. 1976; pp. 860–870.

Reynolds et al, Phys. Technol., vol. 18. #5, pp. 193–203, Sep. 1987; abst. only supplied herewith.

Ukab et al, J. Appl. Phys., vol. 67, #10, pp. 6486–6489, May 15, 1990, abst. only supplied herewith.

Caterini et al, Deutsche Physic. Gesellschaft, vol. B15, #1–6, pp. 535–539, Apr., 1986; abst. only supplied.

Olsen, L. C., "Betavoltaic Energy Conversion", Energy Conversion 13 (1973) 177–127.

Kruzelecky, R. V., "The preparation of amorphous Si:H thin films . . . by glow discharge $SiH_4$ . . . " J. Vac. Sci. Technol. A 7 (4), Jul./Aug. 1989 pp. 2632–2638.

*Primary Examiner*—Nelson Moskowitz
*Attorney, Agent, or Firm*—Ridout & Maybee

[57] ABSTRACT

A nuclear battery is provided by the incorporation through chemical bonding of radioactive tritium in a body of amorphous semiconductor material having a p-type conductivity region, an n-type conductivity region and a semiconductor junction therebetween, with means for electrically connecting the n-type and p-type regions to a load circuit. A preferred such nuclear battery comprises tritium chemically bonded within an amorphous silicon semiconductor including a p-i-n junction.

17 Claims, 2 Drawing Sheets

NUCLEAR BATTERIES

This application is a continuation-in-part application Ser. No. 08/049,305 filed Apr. 21, 1993, now abandoned.

FIELD OF THE INVENTION

This invention relates to nuclear batteries and is particularly concerned with a nuclear powered battery formed by the incorporation of beta-emitting tritium within a body of amorphous semiconductor material with which the tritium is chemically bonded. The preferred such semiconductor material is amorphous silicon with or without dopants. However, the invention is also applicable to nuclear batteries using tritiated microcrystalline semiconductors for the production of electrical energy.

BACKGROUND OF THE INVENTION

The word "battery", as used in this context, pertains to one or a connected set of similar units or cells acting as an electrical energy source. A nuclear battery, also known as an atomic battery, refers to a battery in which the source of energy is the energy stored in the nucleus of the atoms of the fuel. The nuclear energy stored in the nucleus is typically released in one of three ways: fission of the nucleus, fusion of the nucleus, or radioactive decay of the nucleus. Nuclear batteries according to the present invention rely on radioactive decay of nuclei and convert to electrical energy the liberated nuclear radiation (beta particles) energy. Over the last several decades a number of nuclear batteries of the kind relying on nuclear radioactive decay have been developed on the basis of a single conversion process or a double conversion process. Single conversion nuclear batteries directly convert nuclear radiation into electrical energy. Double conversion nuclear batteries convert nuclear radiation energy into an intermediate form of energy which in turn is converted into electrical energy.

Nuclear batteries of the single conversion type include betavoltaic batteries, wherein a semiconductor p-n junction is exposed to nuclear radiation which results in the production of electron-hole pairs and thus an induced current at low voltage. An example is afforded in U.S. Pat. Nos. 2,745,973 and 4,024,420. Another example of single conversion process nuclear batteries is a low voltage battery that uses the principle of gas ionization, wherein the battery consists of an ionization gas, two different electrodes which establish an electric field in the gas space, and a nuclear radiation source which is either gaseous or solid in form. Still another example is afforded by a high voltage, vacuum battery in which one electrode forms the source of charged particle nuclear radiation while the other electrode is chosen to have low secondary emission and high collection efficiency, thus resulting in a high voltage, low current device.

Nuclear batteries of the double conversion process type include photovoltaic batteries (in which the nuclear radiation energy is first converted into electromagnetic radiation, typically by irradiating a phosphorescent material and then exposing a semiconductor p-n junction to electromagnetic radiation to produce low voltage electrical current) and thermoelectric batteries (wherein the nuclear radiation is converted into thermal energy which in turn is converted to electrical energy by means of the Seebeck effect or thermoelectric conversion). Examples of nuclear/photovoltaic batteries are disclosed in U.S. Pat. Nos. 4,628,143; 4,900,368; and 5,008,579.

Energy conversion processes are generally quite inefficient. The single conversion process nuclear batteries have conversion efficiencies typically of the order of 5% or lower. Nuclear batteries using the double conversion process are even more inefficient. The practical limitations on the single conversion betavoltaic, semiconductor battery include significant attenuation in the nuclear radiation energy prior to reaching the semiconductor and further attenuation in energy as the nuclear radiation propagates through the semiconductor, en route to the depletion region.

It is accordingly an object of the present invention to provide a nuclear powered battery having a conversion efficiency superior to presently available single and double conversion nuclear batteries.

It is a further object of the present invention to provide a nuclear powered battery which may be fabricated as an integral part of and provide electrical energy for an integrated circuit.

It is a further object of the present invention to provide a useful article, a nuclear powered battery, in which radioactive tritium, a by-product from nuclear reactors, is chemically bound and thus immobilized in a body of amorphous silicon, thereby making advantageous use of tritium stored in safety facilities.

SUMMARY OF THE INVENTION

With a view to overcoming the above-mentioned limitations and achieving the aforementioned objects, there is provided an electrical energy source comprising a radioactive element chemically bound within a body of amorphous semiconductor in the form of amorphous semiconductor material having a p-type conductivity region, an n-type conductivity region and a semiconductor junction or region therebetween. Means are provided for electrically connecting the n-type and p-type regions to a load circuit.

The semiconductor junction may be of either the p-n or the p-i-n type with an intrinsic or near-intrinsic region disposed between the p and n (regions). According to a preferred embodiment of the invention, the amorphous semiconductor material is amorphous silicon with a radionuclide, preferably tritium, incorporated in the body thereof and the semiconductor junction is an amorphous-silicon-tritium junction. In a semiconductor junction of the p-i-n type, however, effect may be given to the invention by an arrangement in which the p- and n-regions are untritiated or only lightly tritiated compared to a more heavily tritiated i-region between them.

BRIEF DESCRIPTION OF THE DRAWINGS

Examples of the application of the invention to nuclear powered batteries will now be described, by way of example only, with reference to the accompanying drawings, in which.

DESCRIPTION OF THE PREFERRED EMBODIMENTS

General

Figure 1:
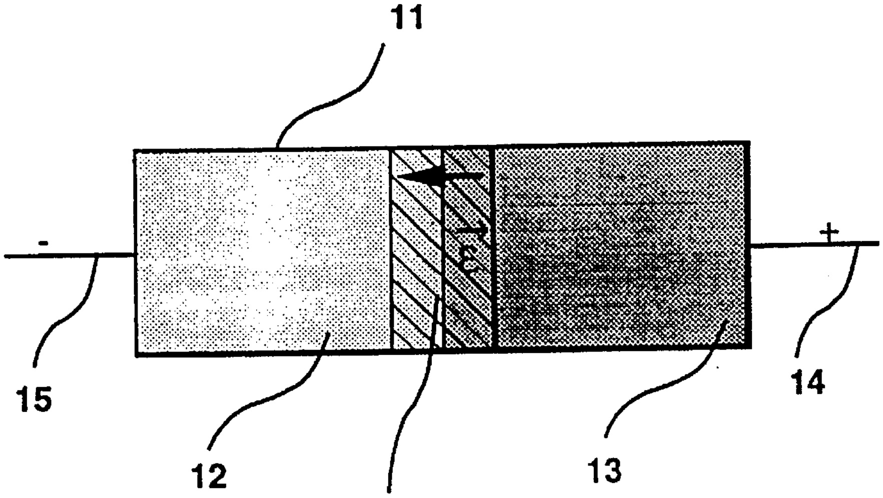
FIG. 1 is a schematic cross-sectional view of a betavoltaic nuclear battery p-n homojunction made using amorphous-silicon tritium.

The present invention, as applied to tritium powered nuclear batteries, is based essentially on a tritiated amorphous semiconductor p-n or p-i-n junction. The p-n or p-i-n junction, or equivalently a p-i-n junction in which the intrinsic region can have a thickness varying from zero to some optimum value x, can be formed using one of several commercially available techniques. For example, glow discharge decomposition of precursor gases may be used to produce the semiconductor materials.

Tritium decay beta particles traverse a p-i-n junction of the present invention, losing energy to the formation of electron-hole pairs and Bremmstrahlung radiation. The electric field present in the depletion region of the p-i-n junction separates the beta-induced electron-hole pairs, thus giving rise to an "intrinsic" nuclear battery which is similar to a betavoltaic battery or photovoltaic battery, but is powered intrinsically by tritium decay betas rather than external electrons or external photons, respectively. The cell current is directly proportional to the rate of production of electron-hole pairs in the depletion region while the cell voltage is characterized by the difference in the work function and electron affinity of the, p and n regions. The cell current can be varied by changing the thickness of the intrinsic region as well as that of the p and n regions, while the cell voltage can be altered by the concentration of p and n dopants and the choice of the host p and n materials.

Selection of Materials

The preferred nuclear cell is tritiated amorphous silicon (a-Si:T, amorphous-silicon-tritium) p-i-n junction. In recent years, hydrogenated amorphous silicon (a-Si:H) has gained considerable technological importance both for large area optoelectronic applications and for the fabrication of microelectronic devices. From the initial demonstration of the feasibility of doping hydrogenated amorphous silicon by Spear and LeComber in *Phil Mag.*, 1976, 33, 935 research has expanded to a large variety of Si-based alloys. A number of different techniques have been developed for the preparation of a-Si:H including glow discharge dissociation of silane ($SiH_4$), reactive sputtering or evaporation of Si in an $H_2$ ambient, thermal chemical vapour deposition (CVD) using $SiH_4$ and photochemical vapour deposition and, more recently, electron cyclotron resonance (ECR) plasma deposition from $SiH_4$.

Many of the gap states that exist in a-Si, because of its defect nature, can be eliminated by hydrogenation. Typically 10 to 25 atom percent hydrogen is introduced into a-Si:H to obtain a material with good intrinsic electronic properties. Because of the low density of gap states in aSi:H it is possible to make the material p-type or n-type by doping. It should be noted that a-Si:H has been used routinely to fabricate p-n or p-i-n junctions with a minimum of recombination centres. The practical effect of minimizing the density of recombination centres is to increase the excess carrier lifetime and therefore the nuclear cell current. The open circuit voltage of a p-n or p-i-n junction with hydrogen content in the range from 10 to 25 atom per cent is about 0.7 volts. The open circuit voltage can also be increased by using heterojunctions.

Amorphous silicon-hydrogen films that are mechanically stable, free of flaking or blistering, with good adherence to the substrate, can be simultaneously deposited onto both conducting and insulating substrates using a discharge in silane, ignited in a d.c. saddle field plasma chamber. Hydrogen incorporation can be controlled through the deposition conditions. For example, at a given deposition temperature, the relative fraction of hydrogen incorporated into monohydride and dihydride sites can be varied via the discharge voltage and pressure: higher voltages (>1000 V) and lower pressures (<50 mTorr) enhance the incorporation of hydrogen into dihydride sites. This is the presently preferred technique, substituting tritium for hydrogen, for forming tritiated amorphous silicon film layers on a substrate to produce nuclear battery junctions according to the present invention. A more detailed description of this known deposition technique may be found in the present applicants' U.S. Pat. No. 5,118,951 and in *J. Vac. Sci. Technol.* A, 1989, 7, 2632 (Kruzelecky et al.), both of which are incorporated herein by reference.

It is fundamental to their utility as semiconductors that a-Si:H and a-Si:T are not simply a mixture or solution of silicon and an isotope of hydrogen, but exhibit non-stoichiometric chemical bonding between the atoms. Thus, although hydrogen is known to diffuse readily into amorphous silicon matrix (non-bonding situation), researchers have been unable to obtain a semiconductor grade material by the simple diffusion of hydrogen into films of pure (unhydrogenated) amorphous silicon. Throughout this specification, reference to a "tritiated" amorphous or microcrystalline semiconductor or use of notations such as "a-Si:T" will indicate the existence of chemical bonding to tritium incorporated within the body of amorphous or microcrystalline semiconductor matrix.

By the processes mentioned above, tritiated amorphous silicon (a-Si:T) p-i-n junction nuclear cells can be formed on a substrate, or nuclear cells involving related alloys such as amorphous silicon carbon, amorphous carbon, and metal-amorphous semiconductor may be formed. The material of the substrate may be glass, crystalline silicon, stainless steel, etc.

The Embodiments

In the accompanying drawings the same reference numerals are used throughout to denote corresponding parts.

FIG. 1 shows a tritiated amorphous silicon p-n junction nuclear cell 11 consisting of p type a-Si:T 12, n type a-Si:T 13, and electrical contact leads 14 and 15 for connecting the two regions 12 and 13 to a load circuit. Regions 12 and 13 are each of thickness of the order of a fraction of a micron (μm). The cross-hatched region 16 represents the internal electric field resulting from the formation of depletion layers due to the electrical contact of the p and n type regions. The internal electric field in the depletion region 16 is denoted by the vector $\epsilon$.

The p and n regions contain a uniform fraction of tritium. Tritium decay betas lose their energy, throughout the p-n junction, to the formation of electron-hole pairs. Electron-hole pairs within the depletion region are separated by the internal electric field, thus giving rise to a current proportional to the rate of formation of electron-hole pairs. The potential difference of the nuclear cell is determined by the host material and the density of the n and p type dopants.

Figure 2:
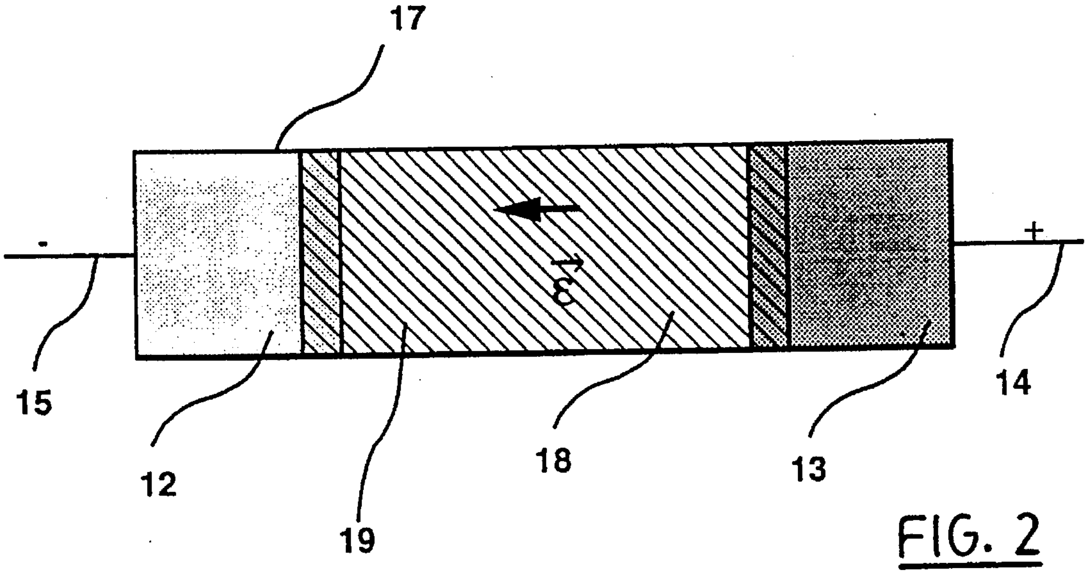
FIG. 2 is a schematic cross-sectional view of a betavoltaic nuclear battery p-i-n homojunction made using amorphous-silicon tritium.

The nuclear cell current, and therefore the power, can be increased by introducing an intrinsic a-Si:T region in the embodiment of FIG. 1. FIG. 2 shows such a nuclear cell, an a-Si:T p-i-n junction 17. The intrinsic, undoped a-Si:T region is denoted by 18. The thickness of 18 is comparable to or greater than the range of the mean energy (5.7 keV) tritium decay beta, that is, of the order of 0.2 μm. The cross-hatched region 19 represents the internal electric field which extends across the intrinsic region and depletion layers in the p and n regions.

The tritiated amorphous silicon p-i-n junction nuclear cell shown in FIG. 2 represents the currently preferred embodiment of the invention.

As a practical example, one may consider an a-Si:T p-i-n junction containing a uniform tritium concentration of 20 atomic percent. Using a silicon atom density, $N_{Si}$, of $5\times10^{22}$ $cm^{-3}$, tritium atom decay constant, λ (=ln $2/t_{1/2}$, where $t_{1/2}$ is the 12.3 year half-life of tritium), of $1.78\times10^{-9}$ $s^{-1}$, and mean energy of tritium decay beta, $E_m$, of 5.7 keV, the power density is computed to be ($0.2*N_{Si}*\lambda*E_m$=) 16 mW $cm^{-3}$. Assuming that 50 percent of this nuclear energy is converted into electrical energy, via separation of electron-hole pairs, a power density of 8 mW $cm^{-3}$ is obtained. Furthermore, if the intrinsic region is 1 μm in thickness and the p and n regions in comparison are quite thin and contribute marginally to the power flux, one obtains a power flux of 0.8 μW $cm^{-2}$. Using a cell potential of 1 volt, one obtains a cell current of 0.8 μA $cm^{-2}$. This current will decline to approximately 0.4 μA $cm^{-2}$ after about 12 years.

The foregoing example computes the power flux of a single nuclear cell according to the invention. These cells can be stacked in series or in parallel to a well known art in solar cells, to obtain a battery of desired current-voltage characteristics. Potential applications include the incorporation of such batteries in integrated circuits, obviating the need to build leads connecting a conventional integrated circuit to a conventional power source.

For the purpose of maximum energy production, all regions of the p-i-n junction according to the present invention would be typically tritiated. However, variations and gradations, where appropriate, in the concentration of tritium as well as in the thickness of the p-,i and n regions can lead to nuclear cells with maximum power and/or maximum conversion efficiency.

Thus, for the purpose of achieving a high efficiency nuclear cell,. albeit one having a lower level of absolute energy production compared to a fully tritiated p-i-n junction, the p- and n- regions could be essentially untritiated compared to the intrinsic or i-region, which would be highly tritiated. This will provide a nuclear cell having a high level of efficiency, defined as the energy obtained per unit of tritium activity. The enhanced efficiency of this arrangement may be explained as follows: The built-in electric field of a typical p-i-n junction extends through the entire i-region but only through relatively small sections of the p- and n-regions, namely those immediately adjacent to the i-region. All of the charge carriers formed in the built-in electric field region of the junction by the tritium decay betas contribute to the current of the cell. Minority carriers that are formed within the p- and n-regions, outside the built-in electric field region but within a diffusion length of it, will also contribute to the current of the cell. However, in amorphous semiconductors the carrier diffusion length is small; consequently, this contribution is expected likewise to be small.

The battery of the present invention may be deposited in conjunction with the circuit layers prior to encapsulation to produce a "ready-to-go" integrated circuit with an integral power source. Medical applications such as the powering of cardiac pacemakers are also contemplated. For certain applications of this kind, where an integrated circuit is powered by a nuclear cell (p-i-n junction) according to the present invention, the nuclear cell being an integral part of the integrated circuit, the "high efficiency" arrangement referred to above, in which the p- and n-regions are lightly tritiated or not tritiated serves the purpose of ensuring that energetic tritium decay electrons do not reach the circuitry itself, in devices where such electrons might interfere with the electronic operation of the integrated circuit.

A side-benefit of the commercial production and use of nuclear batteries according to the preferred embodiment of the present invention is the creation of a safe and useful application of tritium, quantities of which are in costly storage in association with nuclear power plants that generate tritium as a by-product.

The p-n and p-i-n nuclear cells described above are based on one kind of amorphous semiconductor, otherwise known as homojunctions. The range of potential and current properties of nuclear cells can be vastly extended if junctions between different amorphous semiconductors, also known as heterojunctions, are considered.

Figure 3:
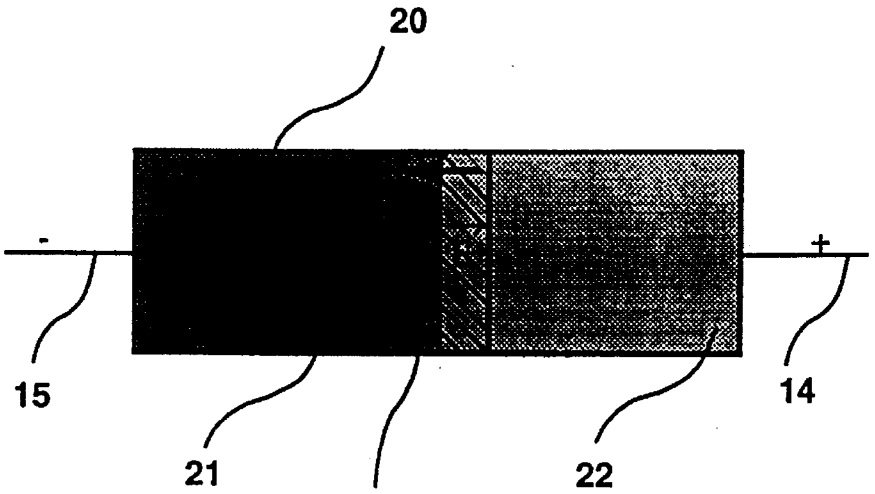
FIG. 3 is a schematic cross-sectional view of a betavoltaic nuclear battery p-n heterojunction made using amorphous-carbon-tritium and amorphous-silicon-tritium.
Figure 4:
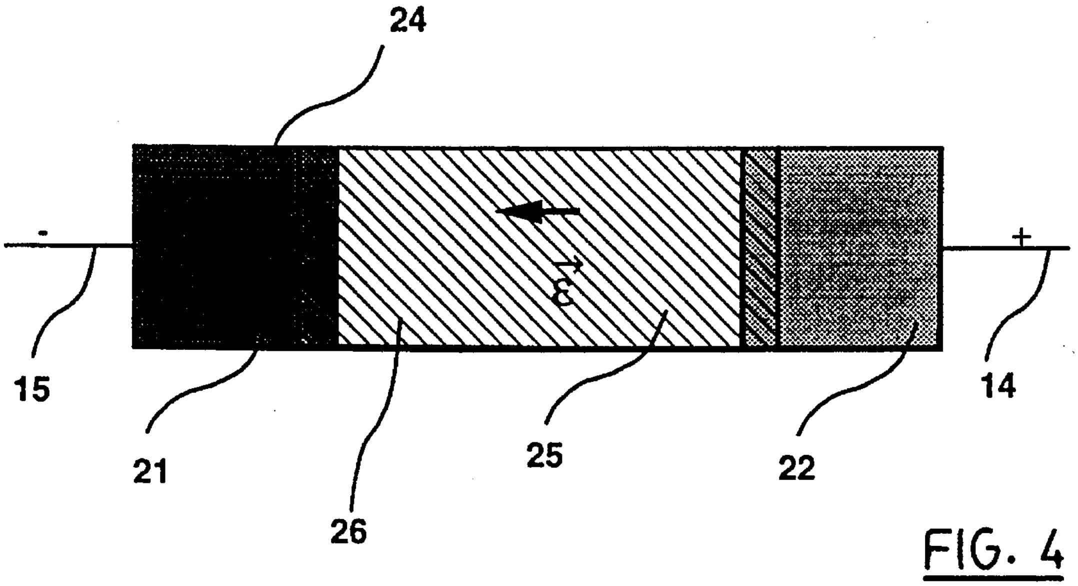
FIG. 4 is a schematic cross-sectional view of a betavoltaic nuclear battery p-i-n heterojunction made using amorphous-carbon-tritium and amorphous-silicon-tritium.

Heterojunction nuclear cells based on the embodiments of FIG. 1 and FIG. 2 are shown in FIG. 3 and FIG. 4. The heterojunction nuclear cells 20 and 24 in these instances consist of p-type tritiated amorphous carbon 21, n-type tritiated amorphous silicon 22, and intrinsic tritiated amorphous silicon 25. The intrinsic region 25 could also be based on tritiated amorphous silicon carbide or indeed another amorphous semiconductor. The cross-hatched regions 23 and 26 represent the internal electric field.

The above described nuclear batteries are formed using amorphous semiconductors. However, the present invention includes within its scope nuclear batteries using crystalline semiconductors, such as crystalline silicon, for the p and n-type regions and a tritiated amorphous semiconductor such as amorphous silicon for the i-region. A particular advantage of such a configuration stems from the larger diffusion length of charge carriers in crystalline materials, conferring an improved ability to collect excess carriers. Doped crystalline materials have carrier diffusion lengths of the order of microns. Therefore, excess carriers generated by tritium decay betas entering the crystal will be well within the diffusion length.

A further structural variation comprehended by the present invention consists of nuclear batteries using microcrystalline semiconductors such as tritiated microcrystalline silicon μc-Si:T, as the material forming any one or all three of the p n i-type regions. Tritiated microcrystalline silicon, μc-Si:T formed for example by neutron irradiation of a-Si:T presents advantages of both crystalline and tritiated amorphous silicon, in that it can more effectively be doped than can amorphous silicon and has tritium retention properties comparable to those of tritiated amorphous silicon.

In the foregoing embodiments the nuclear cell potential is essentially varied by the work function or Fermi level of the selected semiconductors. The nuclear cell potential and so the power characteristics can be further extended by the use of metal-amorphous semiconductor junctions, also known as Schottky barrier junctions. These metal-amorphous semiconductor junctions can be further extended by the use of a thin insulating layer, typically an oxide, between the metal and the semiconductor.

Preferred and alternative embodiments of electrical energy sources according to the present invention have been described herein, but it will be understood that various changes could be made in selecting the materials composing the n- and p-type conductivity regions and the semiconductor junction or region between them without departing from the spirit of the invention. Accordingly, the scope of the invention is to be found in the claims appended hereto rather than by specifically described embodiments.

We claim:

1. An electrical energy source, comprising tritium incorporated within an amorphous semiconductor matrix, in the form of a body of tritiated amorphous semiconductor material, by chemical bonding between the tritium and the amorphous semiconductor material, said body having a p-type conductivity region and an n-type conductivity region with a semiconductor junction therebetween and means for electrically connecting said n-type and p-type regions to a load circuit.

2. An electrical energy source according to claim 1, wherein said semiconductor junction is a p-n junction.

3. An electrical energy source according to claim 2, wherein said p-type conductivity region and said n-type conductivity region of the body are made of the same tritiated amorphous semiconductor material.

4. An electrical energy source according to claim 3, wherein said tritiated amorphous semiconductor material is tritiated amorphous silicon.

5. An electrical energy source according to claim 3, wherein said tritiated amorphous semiconductor material is tritiated amorphous carbon.

6. An electrical energy source according to claim 2, wherein said p-type conductivity region and said n-type conductivity region of the body are made of differing tritiated amorphous semiconductor materials.

7. An electrical energy source according to claim 6, wherein said p-type conductivity region is made of tritiated amorphous carbon and said n-type conductivity region is made of tritiated amorphous silicon.

8. An electrical energy source, comprising tritium incorporated with an amorphous semiconductor matrix in the form of a body of amorphous semiconductor material, said body having a p-type conductivity region and an n-type conductivity region and a tritiated i-type conductivity region therebetween forming p-i-n junction, wherein said i-type conductivity region is tritiated and said p- and n-type conductivity regions are optionally tritiated by chemical bonding between tritium and the amorphous semiconductor material, and means for electrically connecting said n-type and p-type regions to a load circuit.

9. An electrical energy source according to claim 8, wherein said p-type conductivity region, said n-type conductivity region and said i-type conductivity region are made of the same amorphous semiconductor material.

10. An electrical energy source according to claim 9, wherein said amorphous semiconductor material is amorphous silicon.

11. An electrical energy source according to claim 9, wherein said amorphous semiconductor material is amorphous carbon.

12. An electrical energy source according to claim 8, wherein said p-type conductivity region, said n-type conductivity region and said i-type conductivity region are made of differing amorphous semiconductor materials.

13. An electrical energy source according to claim 8, wherein said p-type conductivity region is made of amorphous carbon and said n-type and i-type conductivity regions are made of amorphous silicon.

14. An electrical energy source, comprising a semiconductor matrix having a p-type conductivity region and an n-type conductivity region of a crystalline semiconductor material, an i-type conductivity region between them forming a p-i-n junction, said i-type region consisting essentially of a tritiated amorphous semiconductor, and means for electrically connecting said n-type and p-type regions to a load circuit.

15. An electrical energy source according to claim 14, wherein said crystalline semiconductor material is crystalline silicon and said amorphous semiconductor material is amorphous silicon.

16. An electrical energy source comprising a p-i-n junction formed by p-type, n-type and i-type conductivity regions each consisting of a tritiated microcrystalline semiconductor material and means for connecting said n-type and p-type regions to a load circuit.

17. An electrical energy source, comprising a matrix formed of a p-type conductivity region, an n-type conductivity region and an i-type conductivity region between them forming a p-i-n junction, each of said p-type and n-type conductivity regions being of a material selected from the group consisting of crystalline, microcrystalline and amorphous semiconductors, the p- and n-type conductivity regions being enhanced by the presence of appropriate metal films, and said i-type conductivity region being formed of a tritiated semiconductor material selected from the group consisting of tritiated amorphous semiconductors and tritiated micro-crystalline semiconductors, and means for connecting said n-type and p-type regions to a load circuit.

* * * * *